US008612045B2

(12) United States Patent
Mos et al.

(10) Patent No.: US 8,612,045 B2
(45) Date of Patent: Dec. 17, 2013

(54) OPTIMIZATION METHOD AND A LITHOGRAPHIC CELL

(75) Inventors: Everhardus Cornelis Mos, Best (NL); Mircea Dusa, Campbell, CA (US); Jozef Maria Finders, Veldhoven (NL); Christianus Gerardus Maria De Mol, Son en Breugel (NL); Scott Anderson Middlebrooks, Galveston, TX (US); Dongzi Wangli, Veldhoven (NL)

(73) Assignees: ASML Holding N.V., Veldhoven (NL); ASML Netherlands B.V., Veldhoven (NL)

( * ) Notice: Subject to any disclaimer, the term of this patent is extended or adjusted under 35 U.S.C. 154(b) by 786 days.

(21) Appl. No.: 12/633,252

(22) Filed: Dec. 8, 2009

(65) Prior Publication Data

US 2010/0161099 A1 Jun. 24, 2010

Related U.S. Application Data

(60) Provisional application No. 61/193,813, filed on Dec. 24, 2008, provisional application No. 61/252,811, filed on Oct. 19, 2009.

(51) Int. Cl.
*G05B 13/04* (2006.01)
*G03B 27/42* (2006.01)

(52) U.S. Cl.
USPC .................. 700/121; 700/31; 716/54; 716/55

(58) Field of Classification Search
USPC ........... 700/28, 29, 30, 31, 95, 100, 103, 104, 700/108, 109, 110, 119, 120, 121; 355/53; 438/5, 14; 703/1, 2; 430/5, 22, 30; 716/55, 54
See application file for complete search history.

(56) References Cited

U.S. PATENT DOCUMENTS

| | | | |
|---|---|---|---|
| 4,918,627 A * | 4/1990 | Garcia et al. | 700/182 |
| 5,023,800 A * | 6/1991 | Carver et al. | 700/182 |
| 5,033,014 A * | 7/1991 | Carver et al. | 700/182 |
| 6,178,360 B1 * | 1/2001 | Pierrat et al. | 700/121 |
| 6,738,682 B1 * | 5/2004 | Pasadyn | 700/100 |
| 6,757,579 B1 * | 6/2004 | Pasadyn | 700/108 |
| 6,772,035 B2 * | 8/2004 | Mouli | 700/121 |
| 6,795,163 B2 | 9/2004 | Finders | |
| 6,806,456 B1 * | 10/2004 | Ye et al. | 250/208.1 |
| 6,828,542 B2 * | 12/2004 | Ye et al. | 250/208.1 |

(Continued)

FOREIGN PATENT DOCUMENTS

| | | |
|---|---|---|
| JP | 11-150053 A | 6/1999 |
| JP | 2002-329645 A | 11/2002 |

(Continued)

OTHER PUBLICATIONS

English-Language Abstract for Japanese Patent Publication No. 2008-053687 A, published Mar. 6, 2008; 1 page.

(Continued)

*Primary Examiner* — Charles Kasenge
(74) *Attorney, Agent, or Firm* — Sterne, Kessler, Goldstein & Fox P.L.L.C.

(57) ABSTRACT

Variables in each step in a double patterning lithographic process are recorded and characteristics of intermediate features in a double patterning process measured. The final feature is then modeled, and the values of the variables optimized.

12 Claims, 3 Drawing Sheets

Fig. 1

(56) References Cited

U.S. PATENT DOCUMENTS

| | | | | |
|---|---|---|---|---|
| 6,884,984 | B2* | 4/2005 | Ye et al. | 250/208.1 |
| 6,912,439 | B2* | 6/2005 | Mouli | 700/121 |
| 6,969,837 | B2* | 11/2005 | Ye et al. | 250/208.1 |
| 6,969,864 | B2* | 11/2005 | Ye et al. | 250/559.4 |
| 7,023,549 | B2* | 4/2006 | Shchegrov et al. | 356/369 |
| 7,042,551 | B2* | 5/2006 | Ausschnitt | 355/55 |
| 7,085,676 | B2* | 8/2006 | Opsal et al. | 702/182 |
| 7,092,110 | B2* | 8/2006 | Balasubramanian et al. | 356/625 |
| 7,149,677 | B2* | 12/2006 | Jayaram et al. | 703/22 |
| 7,280,230 | B2* | 10/2007 | Shchegrov et al. | 356/630 |
| 7,318,204 | B2* | 1/2008 | Mouli | 700/29 |
| 7,330,279 | B2* | 2/2008 | Vuong et al. | 356/625 |
| 7,352,439 | B2* | 4/2008 | Van De Mast et al. | 355/53 |
| 7,366,583 | B2* | 4/2008 | Burgess et al. | 700/160 |
| 7,502,709 | B2* | 3/2009 | Funk et al. | 702/127 |
| 7,511,797 | B2* | 3/2009 | Van De Mast et al. | 355/53 |
| 7,547,495 | B2 | 6/2009 | Verstappen et al. | |
| 7,642,020 | B2 | 1/2010 | Han et al. | |
| 7,693,608 | B2* | 4/2010 | Nasle | 700/286 |
| 7,763,404 | B2 | 7/2010 | Willis et al. | |
| 7,894,927 | B2* | 2/2011 | Funk et al. | 700/121 |
| 7,967,995 | B2* | 6/2011 | Funk et al. | 216/59 |
| 8,019,458 | B2* | 9/2011 | Funk et al. | 700/121 |
| 2003/0016339 | A1 | 1/2003 | Taniguchi | |
| 2006/0161452 | A1 | 7/2006 | Hess | |
| 2006/0206851 | A1 | 9/2006 | Van Wingerden et al. | |
| 2007/0050064 | A1* | 3/2007 | Burgess et al. | 700/95 |
| 2007/0231930 | A1* | 10/2007 | Funk et al. | 438/14 |
| 2007/0276634 | A1 | 11/2007 | Smith et al. | |
| 2008/0036983 | A1* | 2/2008 | De Mast et al. | 355/53 |
| 2008/0143985 | A1* | 6/2008 | Mast et al. | 355/53 |
| 2008/0281438 | A1* | 11/2008 | Middlebrooks | 700/29 |
| 2009/0242513 | A1* | 10/2009 | Funk et al. | 216/67 |
| 2009/0258304 | A1 | 10/2009 | Yamada et al. | |

FOREIGN PATENT DOCUMENTS

| | | |
|---|---|---|
| JP | 2004-103674 A | 4/2004 |
| JP | 2006-512758 A | 4/2006 |
| JP | 2007-173807 A | 7/2007 |
| JP | 2007-294813 A | 7/2007 |
| JP | 2007-519981 A | 7/2007 |
| JP | 2008-053687 A | 3/2008 |
| JP | 2008-085330 A | 4/2008 |
| JP | 2009-530668 A | 8/2009 |
| JP | 2010-501120 A | 1/2010 |

OTHER PUBLICATIONS

English-Language Abstract for Japanese Patent Publication No. 2008-085330 A, published Apr. 10, 2008; 1 page.

English-Language Translation of Notice of Reasons for Rejections directed to related Japanese Patent Application No. 2009-280123, mailed Nov. 2, 2011, from the Japanese Patent Office; 3 pages.

English-Language Abstract for Japanese Patent Publication No. 2004-103674 A, published Apr. 2, 2004; 1 page.

English-Language Abstract for Japanese Patent Publication No. 2007-294813 A, published Nov. 8, 2007; 1 page.

* cited by examiner

OPTIMIZATION METHOD AND A LITHOGRAPHIC CELL

CROSS REFERENCE TO RELATED APPLICATIONS

This application claims benefit under 35 U.S.C. §119(e) to U.S. Provisional Patent Application Nos. 61/193,813, filed Dec. 24, 2008 and 61/252,811, filed Oct. 19, 2009, which are both incorporated by reference herein in their entireties.

BACKGROUND

1. Field

The present invention relates to an optimization method and a lithographic cell.

2. Background

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g., comprising part of, one, or several dies) on a substrate (e.g., a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti parallel to this direction. It is also possible to transfer the pattern from the patterning device to the substrate by imprinting the pattern onto the substrate.

The manufacture of an IC chip involves the fabrication of many layers. In order to generate a more detailed pattern a plurality of lithography or etch processing steps may be used in the manufacture of each layer: this is known as double patterning. The first of these is known as lithography-etch-lithography-etch and in this a first pattern is exposed and etched. A second pattern, with features located in the spaces between the features of the first pattern, is then exposed and etched. Thus a pattern of greater frequency can be generated. Another similar double patterning technique is known as lithography-freeze-lithography-etch. A pattern is exposed in the resist, which is then frozen. A second pattern can then also be etched into the resist and both patterns are then etched into the substrate. Another double patterning method is known as the spacer method. In the spacer method resist is put down on the substrate then spacers placed on top of the substrate. The resulting pattern etched into the substrate.

Different variables, such as the exposure dose, affect the resulting feature in an exposure step. However, in a multi-step process such as double patterning the variables from each process step also affect the characteristics of features in subsequent steps. Thus the variables controlling each of the process steps affect each other and the characteristics of the final feature.

SUMMARY

It is desirable to provide a method for optimizing a method of double patterning.

According to a first embodiment of the present invention, there is provided a method of optimizing a lithographic process comprising the following steps. Carrying out a first manufacture step having at least one first variable, the first manufacture step resulting in a first intermediate feature. Measuring a first characteristic of the first intermediate feature. Carrying out a second manufacture step having at least one second variable, the second manufacture step resulting in a second intermediate feature. Measuring a second characteristic of the second intermediate feature. Modeling a final characteristic of a final feature based on the first and second variables and at least one of the first and second characteristics. Measuring the final characteristic. Comparing the modeled final characteristic and the measured final characteristic and updating the model. Modifying at least one of the first variable and the second variable to optimize the final characteristic. Carrying out the first and second manufacture steps using the modified at least one of first and second variables.

According to another embodiment of the present invention, there is provided a processor configured to: model a final characteristic of a feature based on either the first characteristic or the one second characteristic, compare the measured final characteristic and modeled final characteristic, update the model and determine an optimum variable for at least one of the first and second manufacture steps based on the updated model. Alternatively, both first and second characteristics can be used to determine an optimum variable.

According to an aspect of the invention, there is provided a lithographic apparatus comprising the following features. An illumination system configured to condition a radiation beam. A support constructed to support a patterning device, the patterning device being capable of imparting the radiation beam with a pattern in its cross-section to form a patterned radiation beam. A substrate table constructed to hold a substrate. A projection system configured to project the patterned radiation beam onto a target portion of the substrate. A processor configured to: model a final characteristic of a feature based on either the first characteristic or the one second characteristic, compare the measured final characteristic and modeled final characteristic, update the model and determine an optimum variable for at least one of the first and second manufacture steps based on the updated model. Again, both first and second characteristics could also be used to determine the optimum variable.

Further features and advantages of the invention, as well as the structure and operation of various embodiments of the invention, are described in detail below with reference to the accompanying drawings. It is noted that the invention is not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE DRAWINGS/FIGURES

The accompanying drawings, which are incorporated herein and form part of the specification, illustrate the present invention and, together with the description, further serve to explain the principles of the invention and to enable a person skilled in the relevant art(s) to make and use the invention.

Figure 1:
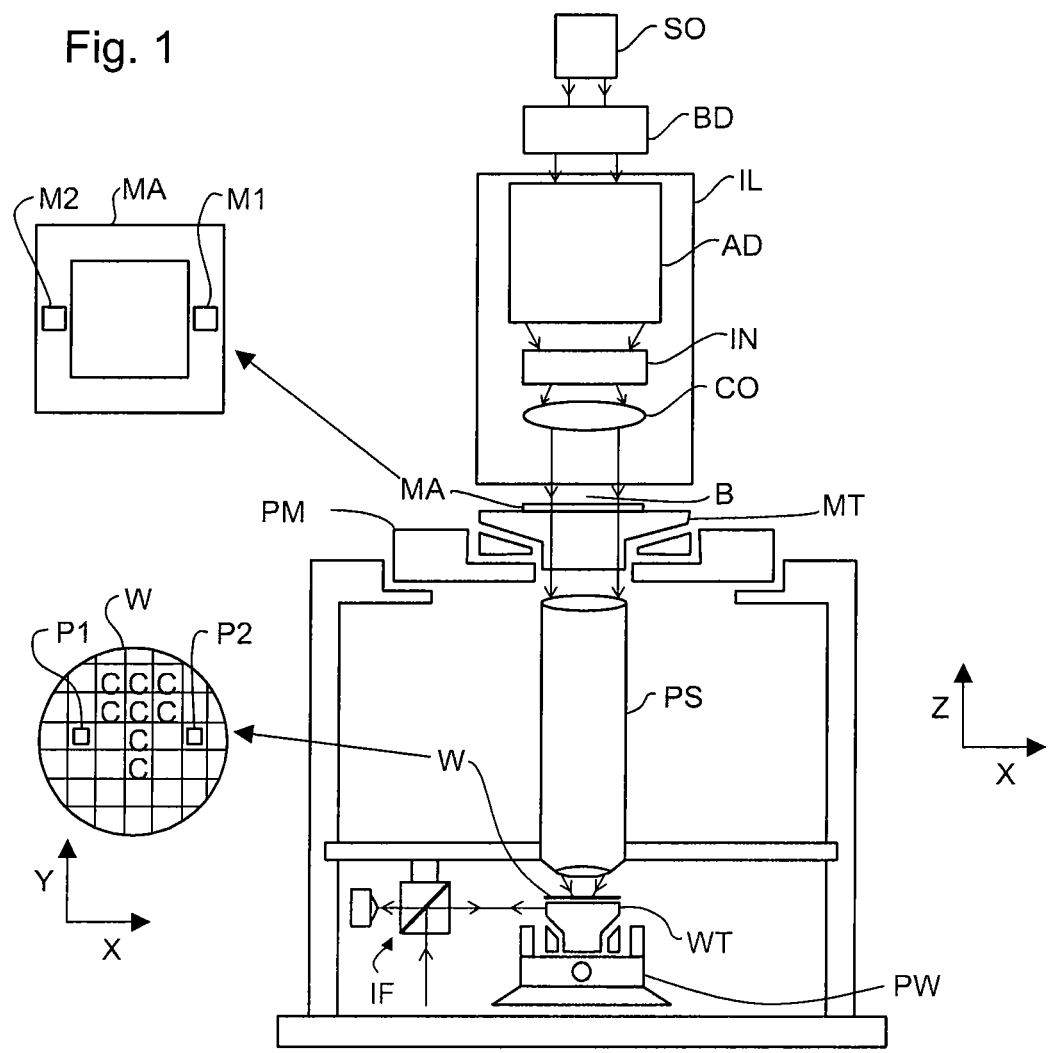
FIG. 1 depicts a lithographic apparatus according to an embodiment of the invention.

The features and advantages of the present invention will become more apparent from the detailed description set forth below when taken in conjunction with the drawings, in which like reference characters identify corresponding elements throughout. In the drawings, like reference numbers generally indicate identical, functionally similar, and/or structurally similar elements. The drawing in which an element first appears is indicated by the leftmost digit(s) in the corresponding reference number.

DETAILED DESCRIPTION

This specification discloses one or more embodiments that incorporate the features of this invention. The disclosed embodiment(s) merely exemplify the invention. The scope of the invention is not limited to the disclosed embodiment(s). The invention is defined by the claims appended hereto.

The embodiment(s) described, and references in the specification to "one embodiment", "an embodiment", "an example embodiment", etc., indicate that the embodiment(s) described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is understood that it is within the knowledge of one skilled in the art to effect such feature, structure, or characteristic in connection with other embodiments whether or not explicitly described.

Embodiments of the invention may be implemented in hardware, firmware, software, or any combination thereof. Embodiments of the invention may also be implemented as instructions stored on a machine-readable medium, which may be read and executed by one or more processors. A machine-readable medium may include any mechanism for storing or transmitting information in a form readable by a machine (e.g., a computing device). For example, a machine-readable medium may include read only memory (ROM); random access memory (RAM); magnetic disk storage media; optical storage media; flash memory devices; electrical, optical, acoustical or other forms of propagated signals (e.g., carrier waves, infrared signals, digital signals, etc.), and others. Further, firmware, software, routines, instructions may be described herein as performing certain actions. However, it should be appreciated that such descriptions are merely for convenience and that such actions in fact result from computing devices, processors, controllers, or other devices executing the firmware, software, routines, instructions, etc.

Before describing such embodiments in more detail, however, it is instructive to present an example environment in which embodiments of the present invention may be implemented.

FIG. 1 schematically depicts a lithographic apparatus according to one embodiment of the invention. The apparatus comprises an illumination system (illuminator) IL configured to condition a radiation beam B (e.g., UV radiation or EUV radiation), a support structure (e.g., a mask table) MT constructed to support a patterning device (e.g., a mask) MA and connected to a first positioner PM configured to accurately position the patterning device in accordance with certain parameters, a substrate table (e.g., a wafer table) WT constructed to hold a substrate (e.g., a resist coated wafer) W and connected to a second positioner PW configured to accurately position the substrate in accordance with certain parameters, and a projection system (e.g., a refractive projection lens system) PS configured to project a pattern imparted to the radiation beam B by patterning device MA onto a target portion C (e.g., comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure supports, i.e., bears the weight of, the patterning device. It holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g., employing a transmissive mask). Alternatively, the apparatus may be of a reflective type (e.g., employing a programmable mirror array of a type as referred to above, or employing a reflective mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type wherein at least a portion of the substrate may be covered by a liquid having a relatively high refractive index, e.g., water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may comprise an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator IN and a condenser CO. The illuminator may be used to condition the radiation beam, to have a desired uniformity and intensity distribution in its cross section.

The radiation beam B is incident on the patterning device (e.g., mask MA), which is held on the support structure (e.g., mask table MT), and is patterned by the patterning device. Having traversed the mask MA, the radiation beam B passes through the projection system PS, which focuses the beam onto a target portion C of the substrate W. With the aid of the second positioner PW and position sensor IF (e.g., an interferometric device, linear encoder or capacitive sensor), the substrate table WT can be moved accurately, e.g., so as to position different target portions C in the path of the radiation beam B. Similarly, the first positioner PM and another position sensor (which is not explicitly depicted in FIG. 1) can be used to accurately position the mask MA with respect to the path of the radiation beam B, e.g., after mechanical retrieval from a mask library, or during a scan. In general, movement of the mask table MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

The depicted apparatus could be used in at least one of the following modes:

1. In step mode, the mask table MT and the substrate table WT are kept essentially stationary, while an entire pattern imparted to the radiation beam is projected onto a target portion C at one time (i.e., a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the mask table MT and the substrate table WT are scanned synchronously while a pattern imparted to the radiation beam is projected onto a target portion C (i.e., a single dynamic exposure). The velocity and direction of the substrate table WT relative to the mask table MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2:
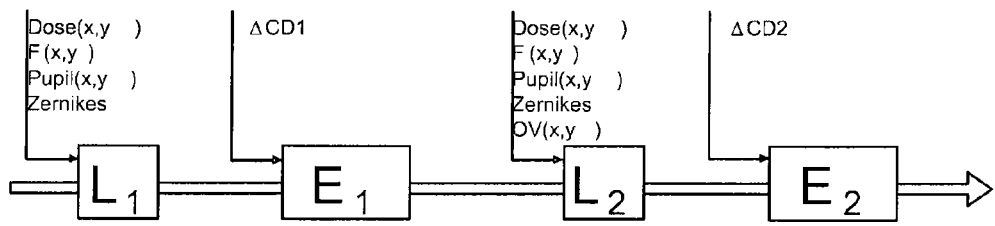
FIG. 2 depicts the steps and variables involved in a multi-step lithographic process.
Figure 3:
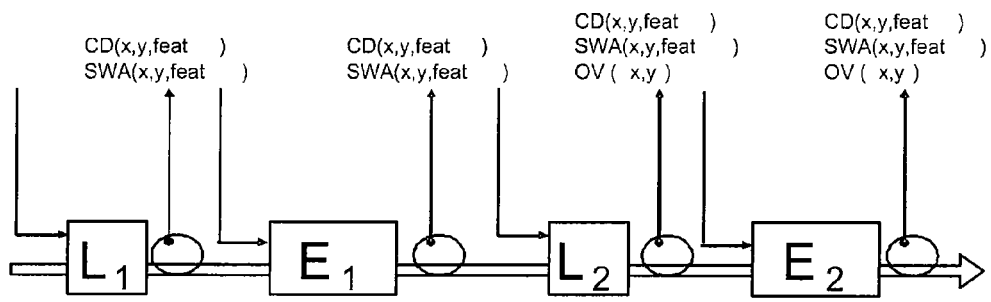
FIG. 3 depicts the measurable characteristics in a multi-step lithographic process.

FIG. 2 depicts a lithography-etch-lithography-etch process, and some of the control variables involved, for example the dose, and the focus. FIG. 3 depicts characteristics which can be measured at each step of the process, for example the critical dimension or the side wall angle. The invention provides a method of using the measured characteristics to optimize the control variables (depicted in FIG. 2).

A first embodiment of the present invention is to use the measured characteristics in a model which will then simulate final characteristics, for example the final critical dimension of the pattern. The model may be derived experimentally, and an example of this is a focus exposure matrix, which determines characteristics of the feature based on the focus dose. Alternatively, the models can be derived from simulations.

Figure 4:
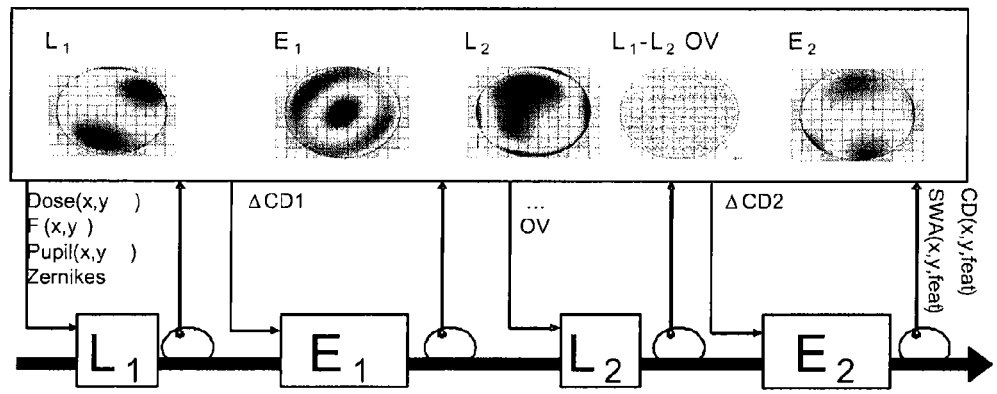
FIG. 4 depicts the variation of disturbances across the substrate at different stages of the process.

Using the model, control variables are input and a final characteristic computed. This is compared with the actual measured characteristic using the same control variables. The difference between the measured value of the final characteristic and the modeled value is used to update the model. This may be by changing the model to change the interaction between different component parts. Alternatively, the disturbances between the measured value and the modeled value may be estimated and mapped across the substrate. The disturbances for each step of the process may be mapped and this is depicted in FIG. 4. In this figure, $L_1$ depicts the disturbances across the substrate after the first lithography step, $E_1$ depicts the disturbances across the substrate after the first etch step. In this figure, $L_2$ depicts the disturbances across the substrate after the second lithography step and $E_2$ depicts the disturbances across the substrate after the second etch step. Different filters such as a Kalman filter may be used in the estimation of the disturbances.

Another embodiment of the present invention is the variation of the control variables such as the control dose and critical dimension to control the characteristics of the final feature. Each variable may be altered and the effect on the final characteristic assessed. For this one or more of the variables is usually maintained at a constant value while the others are varied.

For example, a spacer method of double patterning may be used. In a spacer method of double patterning, variables which can be controlled include the exposure dose across the substrate, the average dose across the substrate, the critical dimension for the first etch and the critical dimension for the target.

Figure 5A:
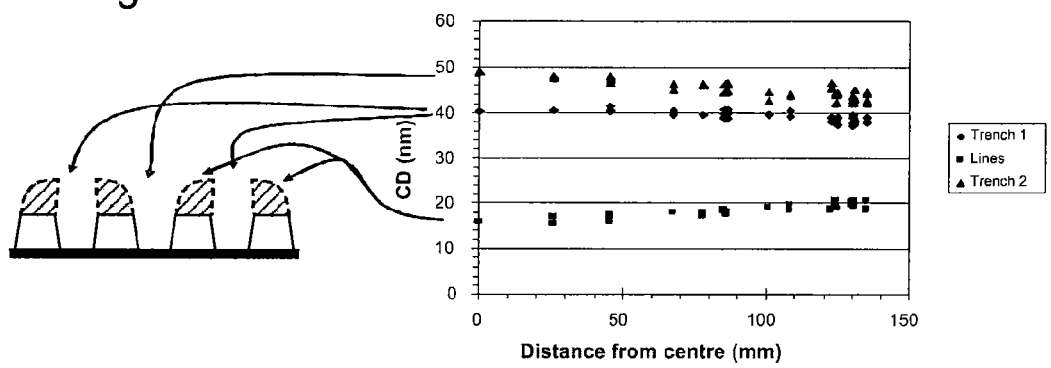
FIGS. 5A and 5B depict the variation of critical dimensions of the final features of the device.
Figure 5B:
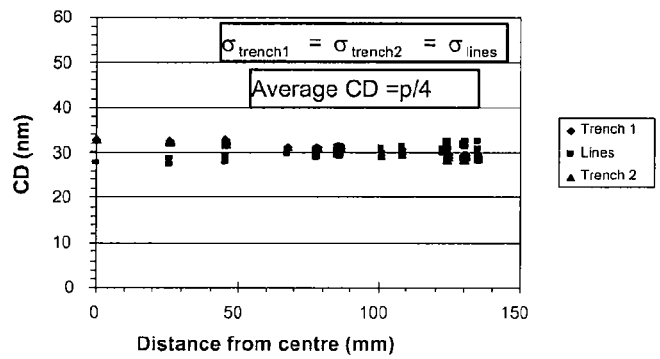

FIG. 5A depicts the resulting critical dimensions of the trenches and the lines measured across the entire substrate. As can be seen, these are neither equal nor consistent across the substrate. In this example, the average dose across the substrate was constrained and other variables such as the variation in dose across the substrate and the critical dimension of the first etch were varied. Once these had been varied and optimized, the results can be seen in FIG. 5B. As can be seen, the trenches and lines are more equal and are consistent across the substrate as a whole.

In the examples above the lithographic and etching steps are controlled. However, other steps such as the deposition process and post exposure bake can be controlled and manipulated using the method of the invention. Indeed any process step which is part of a double patterning technique can be controlled using the method of the embodiments of the present invention.

According to a further embodiment of the invention, a variable affecting both lines and spaces is optimized. In particular, fingerprints of features are described using a parametric model. Different process noises can cause different variations in different spaces and lines. For example, the noise affecting a first space may be different from the noise affecting a second space. In order to achieve the best pattern, the noise across a plurality of the characteristics should be minimized. The critical dimensions of each of the spaces S1 and S2 in double patterning may be optimized by minimizing a S1–S2, for example by minimizing a**(S1–S2), where a is a weighting factor. Thus the optimal parametric fingerprint is based on an objective function of critical dimension uniformity. According to the invention, "a" is derived from the systematic variations and random noise across the substrate. The optimal parametric fingerprint is thus based on a stochastic balancing factor combined with an objective function of critical dimension uniformity. For example, $a=(\sigma_{S1,est}^2-\sigma_{S2,est}^2+\sigma_{sys,Lx}^2)/2\sigma_{sys,Lx}^2$ where $\sigma_{S1,est}^2$ is the estimated process noise for space S1, $\sigma_{S2,est}^2$ is the estimated process noise for space S2 and $\sigma_{sys,Lx}^2$ is the variation in the critical dimension of the features L1 and L2. This is used to optimize a variable in the manufacturing process. For example the optimized parametric fingerprint can be used to control the exposure dose across the substrate or the amount of deposition.

Although the example given here uses characteristics S1 and S2 other model characteristics such as L1 and L2 may also be used. For example *(S1)+a**(L1+L2) could also be minimized and a similar variance weighting factor would be used. The weighting factor a can be based on historic data and adaptively adjusted. S1 and S2 can also be modeled for different feature widths. Although he systematic noise has been described above using the variance this is not completely accurate and different functions which reflect the systematic noise may also be used. In particular, factors involving the half range of the critical dimension may be used.

Although examples have been given using specific types of double patterning techniques the invention is not limited to the double patterning techniques used. Further more, although we have discussed the measurement of a single final characteristic it will be apparent that a plurality of final characteristics could also be used.

As will be clear to the skilled person this invention relates to the minimization (or optimization) of variables within a stochastic model for double patterning. As such, it can be applied to any variables in a stochastic model for any double patterning technique.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography, a topography in a patterning device defines the pattern created on a substrate. The topography of the patterning device may be pressed into a layer of resist supplied to the substrate whereupon the resist is cured by applying electromagnetic radiation, heat, pressure or a combination thereof The patterning device is moved out of the resist leaving a pattern in it after the resist is cured.

The terms "radiation" and "beam" used herein encompass all types of electromagnetic radiation, including ultraviolet (UV) radiation (e.g., having a wavelength of or about 365, 355, 248, 193, 157 or 126 nm) and extreme ultra-violet (EUV) radiation (e.g., having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g., semiconductor memory, magnetic or optical disk) having such a computer program stored therein.

CONCLUSION

It is to be appreciated that the Detailed Description section, and not the Summary and Abstract sections, is intended to be used to interpret the claims. The Summary and Abstract sections may set forth one or more but not all exemplary embodiments of the present invention as contemplated by the inventor(s), and thus, are not intended to limit the present invention and the appended claims in any way.

The present invention has been described above with the aid of functional building blocks illustrating the implementation of specified functions and relationships thereof The boundaries of these functional building blocks have been arbitrarily defined herein for the convenience of the description. Alternate boundaries can be defined so long as the specified functions and relationships thereof are appropriately performed.

The foregoing description of the specific embodiments will so fully reveal the general nature of the invention that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

The breadth and scope of the present invention should not be limited by any of the above-described exemplary embodiments, but should be defined only in accordance with the following claims and their equivalents.

What is claimed is:

1. A method comprising:
   carrying out a first manufacture step having at least one first variable, the first manufacture step resulting in a first intermediate feature;
   measuring a first characteristic of the first intermediate feature;
   carrying out a second manufacture step having at least one second variable, the second manufacture step resulting in a second intermediate feature;
   measuring a second characteristic of the second intermediate feature;
   modeling a final characteristic of a final feature using a model based on at least one of the first variables and at least one of the second variables and at least one of the first and second characteristics;
   measuring the final characteristic;
   comparing the modeled final characteristic and the measured final characteristic by estimating disturbances for the first and second manufacture steps based on a model of the first and second manufacture steps, wherein the estimating is performed using a Kalman filter;
   updating the model;
   modifying at least one of the first variable and the second variable to optimize the final characteristic; and
   carrying out the first and second manufacture steps using the modified at least one of first and second variables.

2. The method according to claim 1, wherein the modifying comprises constraining at least one of the first variable and the second variable.

3. The method according to claim 1, wherein each of the first and second manufacture steps comprise both a lithographic step and an etch step.

4. The method according to claim 1, wherein the first manufacture step comprises a lithographic step and a freezing step and the second manufacture step comprises a lithographic step and an etch step.

5. The method according to claim 1, wherein the first manufacture step comprises a lithography step and an etch step and the second manufacture step comprises an etch step.

6. A lithographic cell comprising:
   a lithographic apparatus configured to project a first pattern having a first variable onto a substrate and project a second pattern having a second variable onto the substrate;
   a measuring system configured to measure a first characteristic of the substrate, measured after the first pattern has been projected, a second characteristic of the substrate, measured after the second pattern has been projected, and a final characteristic of the substrate; and
   a controller configured to model a final characteristic of a feature based on the first and second variables and at least one of the first characteristic and the second characteristic, compare the measured final characteristic and modeled final characteristic, update the model and determine an optimum variable for at least one of the first and second manufacture steps based on the updated model.

7. A method comprising:
   manufacturing a plurality of first features and second features, the second features and the first features alternating, each the second feature separated from a first feature by a first space and each the first feature separated from a second feature by a second space, the first features having a critical dimension L1, the second features having a critical dimension L2, the first space having a critical dimension S1 and the second space having a critical dimension S2, wherein L1, L2, S1 and S2 being characteristics and the manufacturing process having a variable which affects the characteristics of the features and the spaces;
   measuring at least two characteristics V1, V2;
   optimizing the variable by minimizing a relationship between two of the characteristics multiplied by a weighting factor a; and
   manufacturing a plurality of first and second features using the optimized variable,
   wherein the weighting factor a is determined by the variance of V1 and V2.

8. The method according to claim 7, wherein the variable is optimized by minimizing $a*(S1-S2)$ and $a=(\sigma_{S1,est}^2-\sigma_{S2,est}^2+\sigma_{sys,Lx}^2)/2\sigma_{sys,Lx}^2$ where $\sigma_{S1,est}^2$ is the standard deviation of S1, $\sigma_{S1,est}^2$ is the standard deviation of S2 and $\sigma_{sys,Lx}^2$ is the standard deviation of the critical dimensions of the features L1 and L2.

9. The method according to claim 7, wherein a is determined using historic data.

10. The method according to claim 7, wherein a is not 0.5.

11. A method comprising:
    carrying out a first manufacture step having a first variable, the first manufacture step resulting in a first intermediate feature;
    measuring a first characteristic of the first intermediate feature;
    carrying out a second manufacture step having a second variable, the second manufacture step resulting in a second intermediate feature;

measuring a second characteristic of the second intermediate feature;

optimizing at least one of the first and second variables by minimizing a relationship between the first and second characteristics multiplied by a weighting factor a; and carrying out the first and second manufacture steps using the optimized at least one of first and second variables.

12. A lithographic cell comprising:

a lithographic apparatus configured to project a first pattern having a first variable onto a substrate, and project a second pattern having a second variable onto the substrate;

a measuring system configured to measure a first characteristic of the substrate, measured after the first pattern has been projected, and a second characteristic of the substrate, measured after the second pattern has been projected; and a controller configured to optimize at least one of the first and second variables by minimizing a relationship between the first and second characteristics multiplied by a weighting factor a.

* * * * *

UNITED STATES PATENT AND TRADEMARK OFFICE
CERTIFICATE OF CORRECTION

PATENT NO. : 8,612,045 B2
APPLICATION NO. : 12/633252
DATED : December 17, 2013
INVENTOR(S) : Mos et al.

It is certified that error appears in the above-identified patent and that said Letters Patent is hereby corrected as shown below:

In the Claims

Column 10, lines 51-52, claim 8, after "and" delete "$a=(\sigma_{S1,est}^2 - \sigma_{S2,est}^2 + \sigma_{sys,Lx}^2)/2\sigma_{sys,Lx}^2$" and insert -- $a = (\sigma_{S1,est}^2 - \sigma_{S2,est}^2 + \sigma_{sys,Lx}^2)/2\sigma_{sys,Lx}^2$ --

Column 10, line 52, claim 8, after "where" delete "$\sigma_{S1,est}^2$" and insert -- $\sigma_{S2,est}^2$ --

Column 10, line 53, claim 8, after "deviation of" delete "S1, $\sigma_{S1,est}^2$" and insert -- S1, $\sigma_{S2,est}^2$ --

Column 10, line 54, claim 8, delete "$\sigma_{sys,Lx}^2$" and insert -- $\sigma_{sys,Lx}^2$ --

Signed and Sealed this
Twentieth Day of May, 2014

Michelle K. Lee
*Deputy Director of the United States Patent and Trademark Office*